United States Patent
Cabuz et al.

(10) Patent No.: US 6,288,472 B1
(45) Date of Patent: Sep. 11, 2001

(54) ELECTROSTATIC/PNEUMATIC ACTUATORS FOR ACTIVE SURFACES

(75) Inventors: Cleopatra Cabuz, Edina; Thomas R. Ohnstein, Roseville; Michael R. Elgersma, Plymouth, all of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/573,460

(22) Filed: May 17, 2000

Related U.S. Application Data

(62) Division of application No. 09/223,083, filed on Dec. 29, 1998.

(51) Int. Cl.$^7$ .............................. H02N 1/00; G02B 26/00; F16K 31/02
(52) U.S. Cl. ....................... 310/309; 359/291; 251/129.02
(58) Field of Search .............................. 29/596; 310/309, 310/308; 359/291, 226, 295, 230; 251/129.02, 129.05, 129.01

(56) References Cited

U.S. PATENT DOCUMENTS

| | | | |
|---|---|---|---|
| 4,197,737 | * | 4/1980 | Pittman .............................. 73/178 R |
| 5,206,557 | * | 4/1993 | Bobbio ................................. 310/309 |
| 5,350,966 | * | 9/1994 | Culp ..................................... 310/328 |
| 5,452,878 | * | 9/1995 | Gravesen et al. .............. 251/129.02 |
| 5,867,302 | * | 2/1999 | Fleming ................................ 359/291 |
| 5,901,939 | * | 5/1999 | Cabuz et al. ..................... 251/129.02 |

* cited by examiner

Primary Examiner—Nestor Ramirez
Assistant Examiner—Dang Dinh Le
(74) Attorney, Agent, or Firm—John G. Shudy, Jr.

(57) ABSTRACT

An actuator device providing an active surface. The actuator has an electrostatic electrode for electrostatic cooperative action with an opposing electrostatic electrode. The cover has at least one second electrostatic electrode for cooperative electrostatic activation. The cover also has an outer surface forming the active surface. A power supply cause the cooperative electrostatic activation. A quantity of fluid is contained within the cavity for pneumatically defining active surface conditions during cooperative electrostatic actuation. The electrostatic electrodes may comprise a plurality of electrostatic electrodes arranged in a pattern to cause a predetermined change in the active surface. Various patterns may be used, such as bands, patches and regions. Also provided is control electronics.

3 Claims, 2 Drawing Sheets

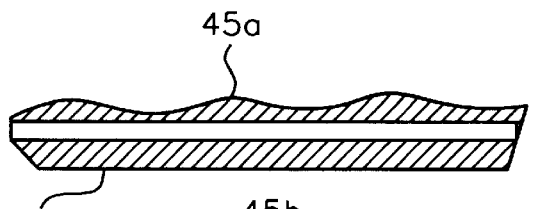
FIG. 4A
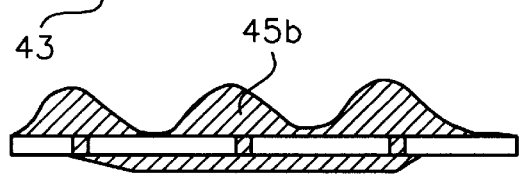
FIG. 4B
FIG. 4C
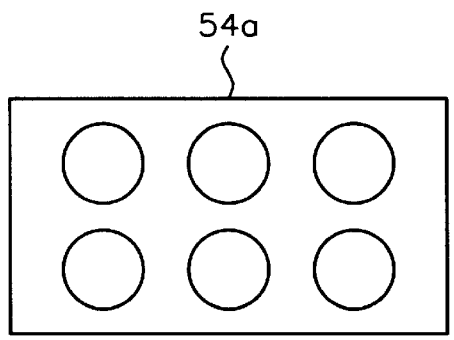
FIG. 5A
FIG. 5B
FIG. 6A
FIG. 6B
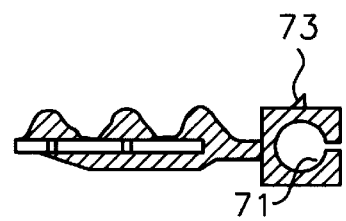
FIG. 6C

ELECTROSTATIC/PNEUMATIC ACTUATORS FOR ACTIVE SURFACES

RELATED U.S. APPLICATION DATA

Division of application Ser. No. 09/223,083, filed on Dec. 29, 1998.

FIELD OF THE INVENTION

The present Invention relates to localized and global control of relatively large surfaces. More particularly the invention relates to the use of electrostatic actuators and pneumatic action to control the shape of a flexible surface.

BACKGROUND OF THE INVENTION

Activation in two or three dimensional arrays of actuators, particularly where the actuators affect a surface shape over a quasi-continuum, have not been developed to date, even though localized and global shape control of relatively large surfaces would offer significant advantage in various technologies. Examples of these technologies where a significant need exists are, among others, micro adaptive flow control, flight control in micro UAV, acoustics, and drag control.

In order to accomplish the yet to be developed control of surfaces, an actuation principle that allows the actuation of large surfaces with out-of-plane forces is desirable. If there is to be adequate control of small flying objects, simple, light, low power actuators are mandatory. Various actuation devices which affect a surface are known to have drawbacks which prevent their use broadly and certainly limit their use in the various needs described above.

Electromagnetic actuation requires heavy magnetic materials and relatively large currents, and the construction of such devices is not compact enough to be suitable for actuation of large surfaces. Clearly, for flight applications this method is excluded because of poor power/weight performance.

Electrothermally induced actuation is structurally suited for activator arrays, but also has the drawbacks of high power requirements, low speed of response and, in many cases dependence on environmental temperatures. Similarly, piezoelectric actuation, while structurally fitted for actuator arrays and uses low power with adequate or high speed, does not possess the displacements needed and are, in fact, so low as to not be useful for the above considered applications. Piezoelectric materials with increased performance have been proposed, but are both very expensive and heavier than would be acceptable.

It would be of great advantage to the art if a low weight, low power, high performance actuator could be developed which would permit localized and global shape control of relatively large surfaces.

It would be another great advance in the art if actuator arrays could be designed which would permit construction of large two and three dimensional arrays useful in a wide range of applications in flow and sound propagation control.

Other advantages will appear hereinafter.

SUMMARY OF THE INVENTION

It has now been discovered that the above and other advantages of the present invention may be realized in the following manner. Specifically, the present invention comprises a series of electrostatic actuation devices which are admirable suited for building large two and three dimensional arrays of actuators that can cooperate to achieve the advantages of the present invention.

Extremely simple, the actuator construction of the present invention may be embedded into the functional device for which it is intended, at a minimum of cost and difficulty. Where a moving surface such as an outer skin of an object is desired, the actuator can be fabricated as the skin. Similarly, where a pump is desired, the actuator becomes the walls of the pump chamber. No additional motors, magnets or high weight power sources are needed. Moreover, the materials required for the electrostatic actuation are conductors for the electrodes and insulators to prevent an electrical short in touch-mode electrostatic actuators, and these materials may be deposited in thin layers over low cost plastic substrates produced by extrusion molding or other methods in desired shapes. The plastic substrates are also available in various off-the-shelf configurations.

The device of this invention broadly comprises a rigid, thin plate with suitable patterned electrodes and embedded circuitry, with a relatively flexible cover. Combined with the plates, the cover creates a cavity that can be sealed. By applying suitable voltages, the shape of the flexible cover can be changed, through the combined effect of electrostatic actuation, built-in elastic force and pneumatic action. Pulling down on the cover in certain areas by electrostatic attraction will result in the displacement of a bubble along the surface, controlled by the pattern of the electrodes and the configuration of the device. Both open and closed cavities are contemplated, as are control of the pressure of the fluid inside the cavity and the magnitude of the built-in elastic force.

Of course, the fluid within the cavity can be a gas or a liquid, depending on the final end use of the product containing the invention. For most flight applications, the fluid will be a gas, while a liquid may be used in other cases such as under water or earth-bound operation.

BRIEF DESCRIPTION OF THE DRAWINGS

For a more complete understanding of the invention, reference is hereby made to the drawings, in which:

FIGS. 4a, 4b and 4c are schematic, sectional views of a two dimensional array using the electrostatic/pneumatic actuators of the present invention;

FIGS. 5a and 5b are schematic plan views respectively of circular and rectangular arrays of controlled bubbles; and FIGS. 6a, 6b and 6c are schematic, side elevational views of three conditions of pressure control for one embodiment of the present invention, illustrating three operating conditions.

DETAILED DESCRIPTION OF THE PREFERRED EMBODIMENT

The present invention provides an improved actuator for controlling the shape of active surfaces, using a combination of electrostatic and pneumatic forces. A fluid, either liquid or gas, is contained in a cavity or chamber. Liquid fluids are used primarily in water or earth-bound applications, while flight applications will normally use a gas for the fluid. The shape of the chamber is controlled by an electrostatic actuator formed by a base and a cover, such that the cover and base cooperatively function as the actuator when power is supplied to electrodes formed in the base and cover. Attraction of the electrodes during electrostatic actuation causes a change in the shape of the cavity or chamber, thus causing changes in the shape of the active surface.

Figure 1A:
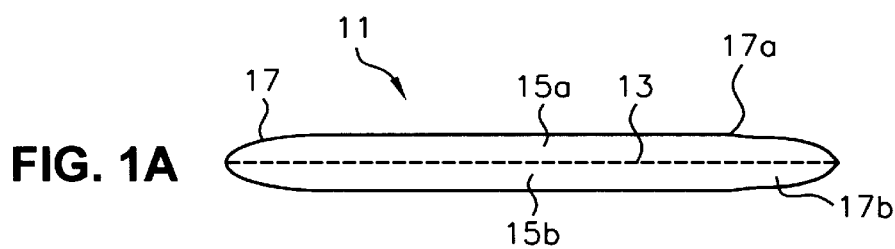
FIGS. 1a, 1b, 1c and 1d are schematic depictions of the electrostatic/pneumatic actuation of a surface, in accordance with the present invention.
Figure 1B:
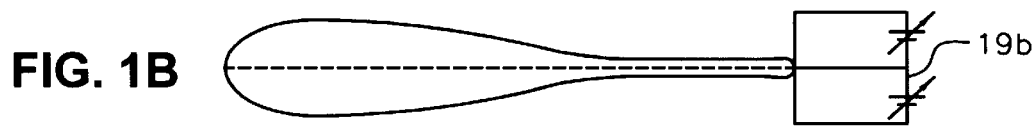

As shown in FIG. 1a, an actuator, 11 generally, comprises a central base 13 and a pair of covers 15a and 15b, each of which covers face inward to the base 13 for providing electrostatic actuator responses with base 13 when power is supplied from a power source. Covers 15a and 15b also form chambers or cavities 17a and 17b, in which is sealed a quantity of gas. In FIG. 1a, there is no actuation in operation and the gas inside cavities 17a and 17b exerts a uniform pressure on all areas of covers 15a and 15b, thus forming a symmetrical shape. In FIG. 1b, actuation of the electrodes on base 13 and covers 15a and 15b at the right end of FIG. 1b in response to power supply 19b has caused the electrodes in these elements to electrostatically attract one another, thus closing the space between electrodes as is accomplished in eletrostatic actuators. As a result, the gas in cavities 17a and 17b is pushed to the right hand side of the device. If, for example, the covers 15a and 15b formed part of a surface used in an aircraft over which air passes, thus permitting control of flight in some desired manner.

Figure 1C:
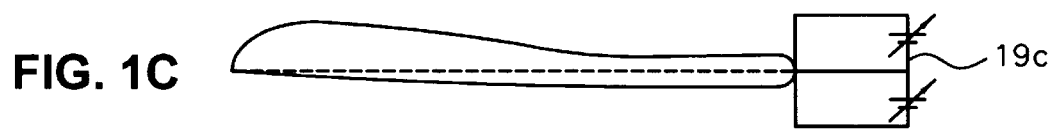
Figure 1D:
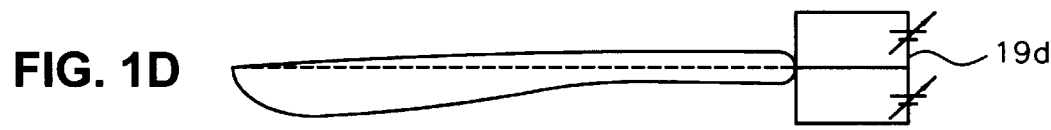

In FIG. 1c, only one pair of electrostatic electrodes has been actuated by power supply 19c, thus causing only cavity 17a and therefore cover 15a to be deformed as an active surface. Similarly in FIG. 15d, only cavity 17b has been actuated by power supply 19d, and therefore cover 15b is deformed as an active surface. Clearly, flight can be controlled in a wide variety of manners as surfaces change. For the first time, active surface control for flight surfaces has been achieved with a low cost, light weight, efficient system, as set forth herein. It is a specific embodiment of the present invention to use the activator device herein as a surface in an aircraft. Covers 17 include a lightweight metal frame and thin diaphragm forming the active surface condition during the intended cooperative electrostatic actuation.

Figures 2A, 2B, 2C:
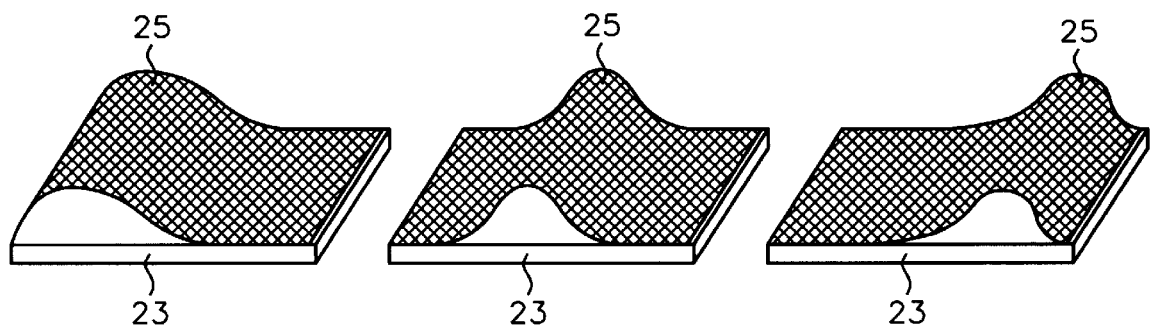
FIGS. 2a, 2b and 2c are a schematic illustration of the action of a surface controlled by the present invention.

FIGS. 2a, 2b and 2c illustrate the rolling action that is accomplished by the present invention, where electrodes are electrostatically actuated to cause a diaphragm or moving electrode to be attracted to an electrode in the base of the device. When this is accomplished, the fluid will no longer be uniformly distributed in the cavity and balanced with elastic forces of the cover sheet. By applying a voltage between cover 25 and base 23 in these FIGS. 2a, 2b and 2c, fluid will be pushed away by the rolling cover, moving from right to left in these figures as shown. In this case the cover 25 can be deflected by its own compressive stress, such as when the cover is buckled, for example.

Figure 3:
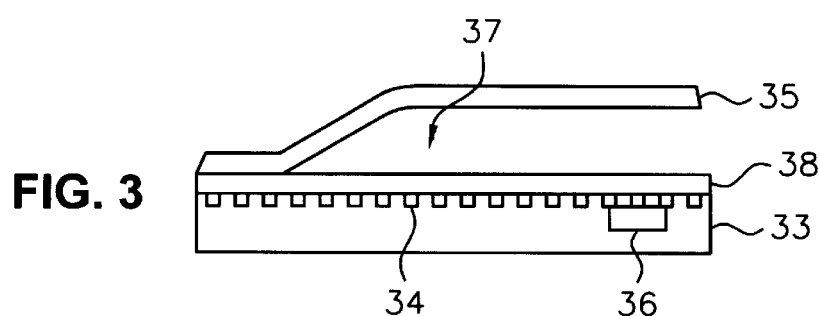
FIG. 3 is a schematic sectional view of part of the surface shown in FIG. 2.

FIG. 3 illustrates some of the details of the electrostatic actuator portion of the present invention. A base 33 is formed from a molded plastic sheet, a light metal frame or other substrate. A pattern array of electrodes 34 are formed on the surface of base 33, in bands, patches with circular or rectangular shapes, or in any shape desired, depending on the desired forces to be applied to the active surface being controlled. Conventional electrostatic actuator control electronics 36 may also be embedded in base 33, and a dielectric 38 applied on top of the array 34 when touch mode actuators are used. Cover 35, which may be formed from a metalized polymer such as a polyester or polyimide, is attached to base 33 so as to define cavity 37, which is then filled with an appropriate fluid.

FIGS. 4a, 4b and 4c illustrate the construction of a two dimensional array of a plurality of electrostatic actuators, in which base 43 interacts with various portions of the covers 45a and 45b as illustrated. In this embodiment, fluid passes through openings in base 43 to further provide control of a variety of active surface shapes. FIGS. 5a and 5b illustrate two varieties (of the virtually unlimited choices) for a circular array 54a or a rectangularly shaped array 54b.

In all of the devices of this invention, electrostatic activation will cause attraction between the base electrode and the moveable electrode or diaphragm on the cover, thus providing for a controlled adjustment of the shape of the active surface via pneumatic response by the fluid. The pressure in the cavities or chambers acts as an out-of-plane, restoring force to enhance deflection and, also, to fight the known electrostatic actuator phenomenon of stiction. When a pair of actuators is used, such as shown in FIGS. 1a–1d, the camber of a wing can be controlled. Two dimensional arrays of actuators as illustrated for purposes of example herein can be used for active surface control for acoustic purposes, or drag control in other materials. The use of a sealed cavity permits the use of a clean and stable fluid, facilitating the task of the electrostatic actuators associated with the fluid.

FIGS. 6a, 6b and 6c illustrate the operation of a sealed cavity actuator, which is based on the pressure inside the cavity being slightly higher than the pressure outside the cavity. Of course, temperature variations could affect this balance, such as when a gas is used as the fluid inside the chamber or cavity. One solution to the effect of temperature on the gas inside the cavity is to include a balloon 71 and check valve 73. Balloon 71 expands when the outside pressure is higher than the inside pressure, reducing the enclosed volume and increasing the pressure without air from the outside entering the enclosed cavity. This solution eliminates the need for filters and ensures the proper operation of the electrostatic actuator, by preventing humidity and particles from entering the cavity. When the inside pressure is higher than the outside pressure, the balloon 71 deflates and, if necessary, some gas can leak through a check valve 73.

An alternative embodiment is when the cavity is open to the atmosphere, such as if check valve 73 was eliminated and balloon 71 communicated directly with the outside atmosphere. In this embodiment, the cover such as cover 45 in FIGS. 4a–4c, would be buckled or otherwise out of plane. Application of the electrostatic force will still move the location of the bubble or cavity, changing the overall shape of the envelope defined by cover 45a–45c. In order to demonstrate the efficacy of this concept, an array of doubly supported beams was constructed for silicon microvalve applications. Operation of the active surface control was also achieved on larger area actuators based on molded plastic substrates and diaphragms made out of plastic materials such as polyimides.

Typical but not limiting polymer sheets which may be used in the present invention are flexible and not brittle, properties found in many polymers. One particularly useful polymer is the polyimide sold as KAPTON®, (registered trademark of E. I. du Pont de Nemours & Co., Wilmington, Del.). Others include KALADEX® (registered trademark of ICI Films, Wilmington, Del.) and MYLAR® (registered trademark of E. I. du Pont de Nemours & Co., Wilmington, Del.), or any flexibly elastic polymer that permits it to deform as described herein. Fabrication of the sheets may be based upon technology developed for keyboard and flexible circuits that are produced in huge quantities, although not for electrostatic actuators at this time, making the process well optimized. Preferred sheets are made from polymer films such as KAPTON® or MYLAR® (registered trademark of E. I. du Pont de Nemours & Co., Wilmington, Del.), or different polyesters that are commercially available.

Preferred electrodes are aluminum electrodes deposited directly on the polymer sheets with one or more dielectric films, such as aluminum oxide, or other suitable organic or inorganic dielectrics. Coating layers such as diamond like layers or self assembled monolayers are also contemplated in order to control surface properties. The base plate may be made of molded polymers with embedded electrodes and electronics for localized control. As noted, when flight applications are considered, use of a light metal frame with a thin diaphragm may be used.

In order to obtain the desired dielectric strength, pinhole free dielectric will be used together with specific schemes to locally interrupt the electrode at the location of the pinhole in order to prevent an electrical short. This technique is known as a self healing technique. High quality dielectrics on the plastic substrates can be obtained: (a) transfer of LPCVD nitrides or another high quality dielectric from silicon wafers to the base plate by bonding; (b) use of organic dielectrics such as parylene, acrylates, or polyimides; or (c) the use of inorganic dielectrics deposited at low temperature through ion beam spattering or plasma assisted deposition to increase the dielectric strength.

The mechanical design of the present invention has many forms. Metalized Kapton membranes with thicknesses of 50 to 75 microns have been made, illustrating that electrostatic actuation against pressures of a few psi can be easily achieved when a dielectric with a dielectric strength of more than 2 to 3 MV/cm is available on the desired area. It is clear the present invention permits the application of envelope control in micro UAV, resulting in full attitude control at a very advantageous power to weight ratio. Simulations have shown attitude control can be achieved with a change in camber of 2% to 4%, which means a change in deflection of about 0.6 to 1.2 mm over a cord of 3 cm, which means the deflections can be easily controlled with the electrostatic pneumatic actuator of this invention.

This invention relates to the combination of electrostatic actuator arrays with pneumatic action, and any such array technology presently existing to accomplish this combination is contemplated as being within the scope of this invention. While particular embodiments of the present invention have been illustrated and described, it is not intended to limit the invention, except as defined by the following claims.

What is claimed is:

1. A method for forming and controlling a flexible surface having a quasi-continuum in a plurality of locations, comprising the steps of:

providing a base having a plurality of first electrostatic electrodes forming array and mounted therein and oriented to present said first electrostatic electrodes for electrostatic cooperative action with an electrostatic electrode positioned above it;

mounting a cover above said first electrostatic electrodes to a cover mounted above said first electrostatic electrodes to define an array of enclosed cavities, said cover having a second electrostatic electrode facing each of said cavities for cooperative electrostatic activation between said first and second electrostatic electrodes, said cover having a flexible outer surface adapted to move in a plurality of locations to provide a quasi-continuous change in said surface between maximum and minimum distances of separation between said base and said surface;

connecting a power supply to said at least one first and second electrostatic electrodes for causing cooperative electrostatic activation between portions of said flexible surface; and filling said cavities with a quantity of fluid for pneumatically defining a plurality of flexible surface conditions during said cooperative electrostatic actuation whereby the shape of the flexible outer surface is varied quasi-continuously from said maximum and minimum distances during said cooperative electrostatic actuation.

2. The method of claim 1, which further includes the step of controlling pressure in said cavity by closing said cavity and connecting said cavity to a pressure control to provide a sealed cavity for movement of said fluid during said cooperative electrostatic actuation.

3. The method of claim 1, wherein said at least one first electrostatic electrode comprises a plurality of electrostatic electrodes arranged in a pattern selected from bands, patches and regions, to cause a predetermined change in said active surface.

* * * * *